United States Patent
Kim et al.

(10) Patent No.: US 8,772,095 B2
(45) Date of Patent: Jul. 8, 2014

(54) METHOD OF MANUFACTURING SEMICONDUCTOR DEVICE USING STRESS MEMORIZATION TECHNIQUE

(75) Inventors: Seok-Hoon Kim, Hwaseong-si (KR); Sang-Su Kim, Yongin-si (KR); Chung-Geun Koh, Seoul (KR); Sun-Ghil Lee, Goyang-si (KR); Jin-Yeong Joe, Suwon-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 13/495,062

(22) Filed: Jun. 13, 2012

(65) Prior Publication Data
US 2013/0115742 A1 May 9, 2013

(30) Foreign Application Priority Data
Nov. 4, 2011 (KR) .................. 10-2011-0114631

(51) Int. Cl.
*H01L 21/00* (2006.01)
(52) U.S. Cl.
USPC ........... 438/166; 438/303; 438/482; 438/486; 438/514; 257/52; 257/610
(58) Field of Classification Search
USPC ............ 438/166, 482, 486, 514, 303; 257/52, 257/610
See application file for complete search history.

(56) References Cited

U.S. PATENT DOCUMENTS

| | | | |
|---|---|---|---|
| 6,030,863 A | 2/2000 | Chang et al. | |
| 7,888,194 B2 | 2/2011 | Jeng et al. | |
| 2007/0254461 A1* | 11/2007 | Wei et al. | 438/514 |
| 2008/0108208 A1* | 5/2008 | Arevalo et al. | 438/514 |
| 2009/0090982 A1* | 4/2009 | Ranade et al. | 257/408 |
| 2011/0057266 A1* | 3/2011 | Wallner et al. | 257/378 |
| 2011/0104864 A1* | 5/2011 | Jeng et al. | 438/305 |
| 2012/0068193 A1* | 3/2012 | Chan et al. | 257/77 |

FOREIGN PATENT DOCUMENTS

KR 10-2005-0115507 A 12/2005

* cited by examiner

*Primary Examiner* — Kyoung Lee
*Assistant Examiner* — Ratisha Mehta
(74) *Attorney, Agent, or Firm* — Volentine & Whitt, PLLC (57) ABSTRACT

The manufacturing a semiconductor device includes providing a substrate supporting a gate electrode, amorphizing and doping the source/drain regions located on both sides of the gate electrode by performing a pre-amorphization implant (PAI) process and implanting C or N into the source/drain regions in or separately from the PAI process, forming a stress inducing layer on the substrate to cover the amorphized source/drain regions, and subsequently recrystallizing the source/drain regions by annealing the substrate. The stress inducing layer may then be removed. Also, the C or N may be implanted into the entirety of the source/drain regions after the regions have been amorphized, or only into upper portions of the amorphized source/drain regions.

23 Claims, 13 Drawing Sheets

METHOD OF MANUFACTURING SEMICONDUCTOR DEVICE USING STRESS MEMORIZATION TECHNIQUE

This application claims priority from Korean Patent Application No. 10-2011-0114631 filed on Nov. 4, 2011 in the Korean Intellectual Property Office, the disclosure of which is hereby incorporated by reference in its entirety.

BACKGROUND

1. Field of the Inventive Concept

The present inventive concept relates to a method of manufacturing a semiconductor device using a stress memorization technique (SMT).

2. Description of the Related Art

The conductivity of a channel region of a metal oxide semiconductor (MOS) transistor may be increased to improve the performance of the MOS transistor. For example, the lattice structure of the channel region may altered to increase the charge-carrier mobility and hence, the conductivity of the channel region.

A stress memorization technique (STM) is one of the techniques that can be used to alter the lattice structure of the channel region. Specifically, an STM entails forming an amorphous region near a channel region in which the channel of the MOS transistor will form, and annealing the amorphous region while a stress inducing layer is located on the amorphous region. The amorphous region is thus recrystallized in a state in which stress is exerted thereon by the stress inducing layer. As a result, deformed crystals are formed. The deformed crystals maintain their deformed state even after the stress inducing layer is removed. Accordingly, the stress is considered to be memorized in the deformed crystals.

The deformed crystals act as a stressor on the channel region, affecting the lattice structure of the channel region, and thereby increasing the charge-carrier mobility.

Meanwhile, during the recrystallization process of SMT, the crystals tend to grow at different rates in various crystallographic directions because the amorphous region is recrystallized under the stress induced therein by the stress inducing layer. For example, in the recrystallization process, the crystal growth rate may be greater in a <001> crystallographic direction than in a <110> crystallographic direction. In this case, a point at which crystal growth pinches off can appear near a (111) facet, thus creating a stacking fault, i.e., a defective region. Halo boron segregation can occur at the defective region, causing problems such as a reduction in the desired threshold voltage and undesired amounts of off-leakage current.

SUMMARY

According to one aspect of the inventive concept, there is provided a method of manufacturing a semiconductor device which includes providing a structure that has a substrate and a gate electrode at an upper part of the substrate, forming doped amorphous source/drain regions to both sides of the gate electrode, respectively, such that the amorphous source/drain regions are spaced from each other across a channel region of the substrate, and subsequently annealing the substrate to recrystalize the doped amorphous source/drain regions, and in which the doped amorphous source/drain regions are formed at least by implanting, into the substrate, impurities that will minimize differences between crystal growth rates in different crystallographic directions during the annealing of the substrate.

According to another aspect of the present inventive concept, there is provided a method of manufacturing a semiconductor device which includes providing a substrate and a gate electrode disposed on an upper part of the substrate such that the substrate has source/drain regions located to the sides of the gate electrode, respectively, and a channel region interposed between the source/drain regions, and inducing stress in the channel region of the substrate by growing crystals in the source/drain regions at substantially the same rates in both <001> and <110> crystallographic directions substantially perpendicular and parallel to an upper surface of substrate, respectively, and in which the inducing of stress in the channel region includes amorphizing the source/drain regions to form amorphous source/drain regions, and subsequently subjecting the amorphous source/drain regions to a solid phase epitaxial (SPE) growth process that recrystallizes the amorphous source/drain regions.

According to still another aspect of the present inventive concept, there is provided a method of manufacturing a semiconductor device which includes providing a substrate and a gate electrode at an upper part of the substrate such that the substrate has source/drain regions located to the sides of the gate electrode, performing a pre-amorphization implantation (PAI) process that amorphizes the source/drain regions, implanting C or N into the amorphized source/drain regions, forming a stress inducing layer that covers the substrate, subsequently recrystallizing the amorphized source/drain regions by annealing the substrate, and removing the stress inducing layer after the substrate has been annealed.

According to yet another aspect of the inventive concept, there is provided a method of manufacturing a semiconductor device which includes providing a substrate and a gate electrode disposed on an upper part of the substrate such that the substrate has source/drain regions located to the sides of the gate electrode, amorphizing the source/drain regions by implanting C or N into the source/drain regions in a temperature range of −20 to −100° C., forming a stress inducing layer over the substrate, and recrystallizing the amorphized source/drain regions by annealing the substrate while the stress inducing layer is disposed over the substrate.

BRIEF DESCRIPTION OF THE DRAWINGS

The above and other aspects and features of the present inventive concept will become more apparent from the detailed description of preferred embodiments that follows as made with reference to the attached drawings, in which.

DETAILED DESCRIPTION OF THE PREFERRED EMBODIMENTS

Various embodiments and examples of embodiments of the inventive concept will be described more fully hereinafter with reference to the accompanying drawings. In the drawings, the sizes and relative sizes and shapes of elements, layers and regions, such as implanted regions, shown in section may be exaggerated for clarity. In particular, the cross-sectional illustrations of the semiconductor devices and intermediate structures fabricated during the course of their manufacture are schematic. Also, like numerals are used to designate like elements throughout the drawings.

It will also be understood that even if an element or layer is formed directly on another element or layer as shown in the drawings, if the element or layer is described to as being "on" or "over" the other element or layer, such a description includes not only the illustrated case in which the element or layer is formed directly on the other element or layer but also the case in which an intervening element(s) or layer(s) is/are present.

Other terminology used herein for the purpose of describing particular examples or embodiments of the inventive concept is to be taken in context. For example, the terms "comprises" or "comprising" when used in this specification specifies the presence of stated features or processes but does not preclude the presence or additional features or processes.

A first embodiment of a method of manufacturing a semiconductor device according to the present inventive concept will now be described with reference to FIGS. 1 through 10.

Figure 1:
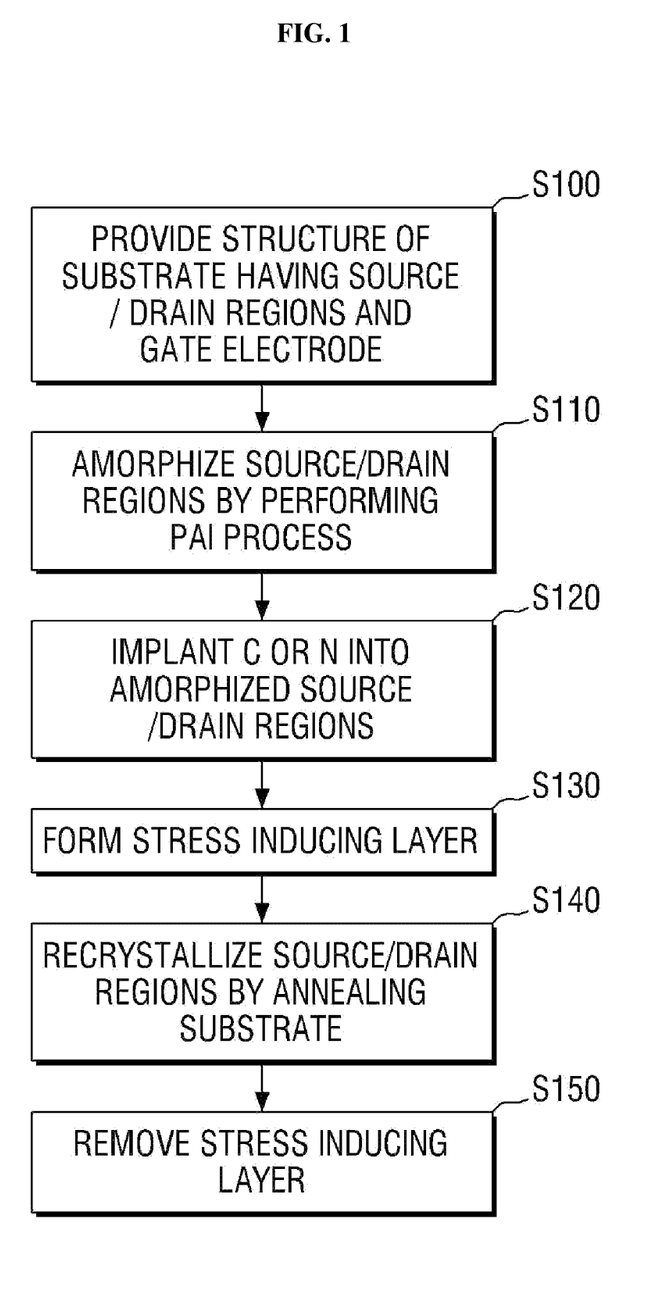
FIG. 1 is a flowchart of a first embodiment of a method of manufacturing a semiconductor device according to the present inventive concept.
Figure 2:
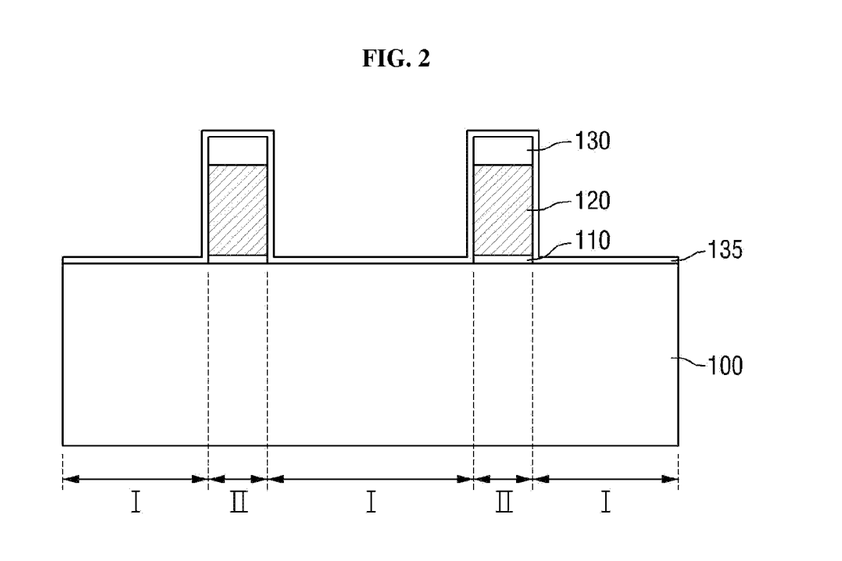
FIGS. 2 through 8 and 10 are cross-sectional views of intermediate structures and together illustrate examples of the first embodiment of the method of manufacturing a semiconductor device according to the present inventive concept.

Referring first to FIGS. 1 and 2, a substrate 100 having a gate electrode 120 thereon is provided (S100). The gate electrode 120 is located atop a channel region II of the substrate, and source/drain regions I of the substrate 100 are located on both sides of the channel region II and hence, to the sides of the gate electrode 120.

In a more specific example of this stage S100 of the method, a gate insulating film pattern 110, gate electrode 120, and a gate mask film pattern 130 are formed on the substrate 100, and a spacer film 135 is then conformally formed on the substrate 100, i.e., so as to conform to the underlying topography including the gate electrode 120 and gate mask film pattern 130. In this respect, the substrate 100 may be (i.e., can be but is not limited to) a P-type substrate, a bulk silicon substrate, or a silicon-on-insulator substrate. The gate insulating film pattern 110 may be of silicon oxide, silicon nitride, SiON, GexOyNz, GexSiyOz, a high-k material, or a laminate (stack of layers) of respective ones of these materials. Examples of the high-k material include (but again are not limited to) $HfO_2$, $ZrO_2$, $Al_2O_3$, $Ta_2O_5$, hafnium silicate, zirconium silicate, and laminates of respective ones of these materials. The gate electrode 120 may be a single film of poly-Si, poly-SiGe, poly-Si doped with impurities, a metal such as Ta, TaN, TaSiN, TiN, Mo, Ru, Ni or NiSi, or a metal silicide, or a laminate of respective ones of these materials. The gate mask film pattern 130 may be of silicon oxide or silicon nitride. The spacer film 135 may comprise silicon nitride.

Figure 3:
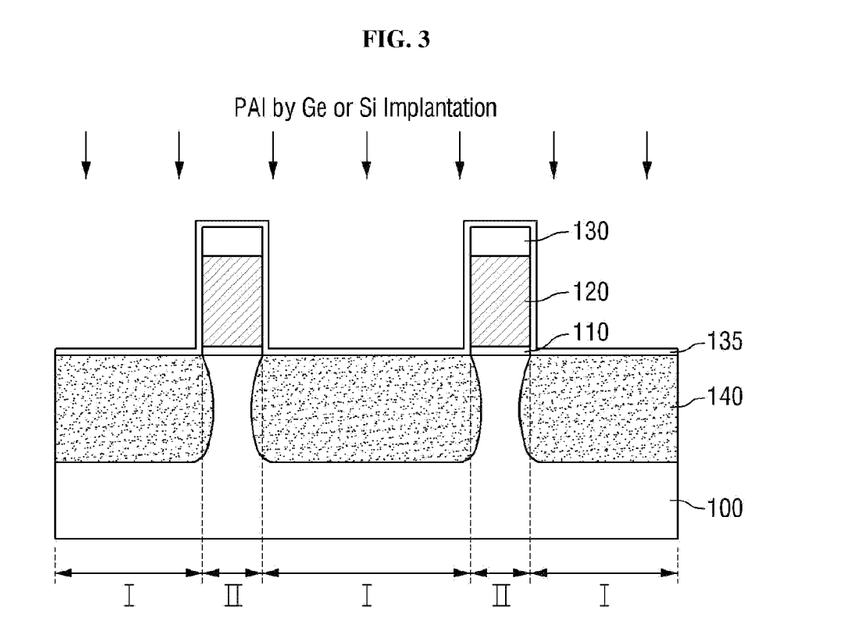

Referring to FIGS. 1 and 3, a pre-amorphization implantation (PAI) process is then performed to amorphize the source/drain regions I (S110).

Specifically, in this embodiment, Ge or Si is implanted into the source/drain regions I, thereby forming amorphous regions 140. At this time, the gate mask film pattern 130 protects the gate electrode 120. Also, those portions of the spacer film 135 extending along the sidewalls of the gate electrode 120 substantially prevent the Ge or Si from being implanted in the channel region II.

However, some of the Ge or Si implanted into the source/drain regions I tends to diffuse laterally in the substrate 100. Accordingly, part of the channel region II of the substrate 100 (specifically, portions of the channel region II adjacent to the source/drain regions I) could be amorphized as a result of the PAI process. With this in mind, the Ge or Si is preferably implanted with an implantation energy of 10 to 35 KeV to minimize the lateral diffusion of the impurities implanted during in the PAI process. That is, the energy level of the PAI process can be controlled to minimize the amorphization of the channel region II.

Figure 4:
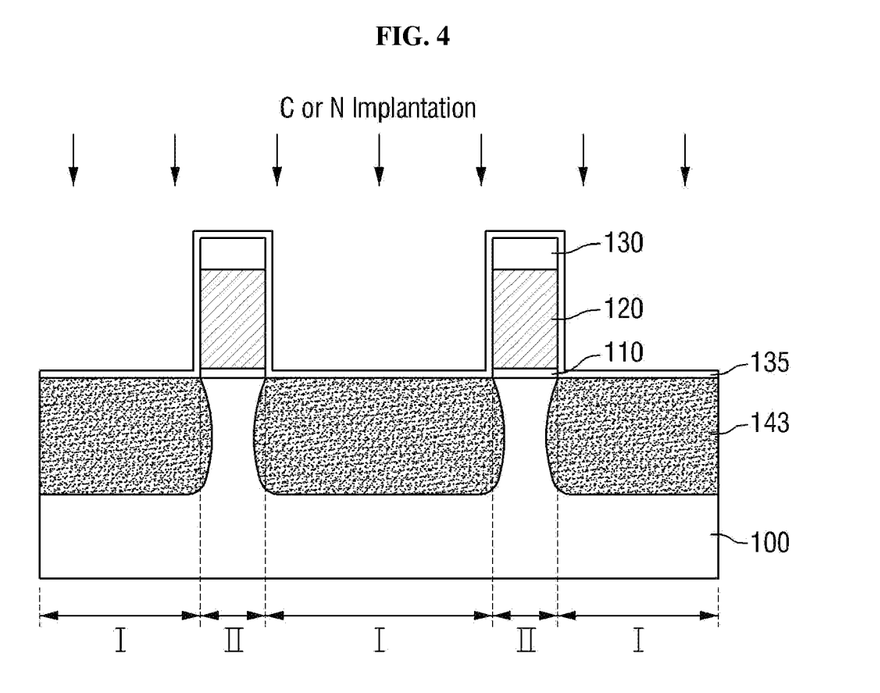

Referring to FIGS. 1 and 4, C or N is then implanted into the amorphized source/drain regions I (S120). That is, in the first embodiment of the method of manufacturing a semiconductor device according to the present inventive concept, additional impurities are implanted into the source/drain regions I after the amorphous regions 140 (see FIG. 3) are formed in the source/drain regions I, thereby forming doped amorphous regions 143. In this case, as well, the implantation process is preferably performed with an implantation energy of 10 to 15 KeV to minimize the lateral diffusion of C or N into the channel region II.

In addition, in one example of this embodiment, the C or N is implanted at a dosage of 1E14 to 5E15 atoms/$cm^2$ for reasons that will be described later.

Furthermore, the additional implantation process may be performed such that the concentration of the C or N is uniform across the entire doped amorphous regions 143. However, the present inventive concept is not limited thereto. For example, the concentration of the C or N at an upper portion of each of the doped amorphous regions 143 may be different from that at a lower portion thereof. That is, the dosage of C or N may be controlled to produce a desired gradient in the concentration of the C or N in each of the doped amorphous regions 143. For example, the dosage may be controlled such that upper portion of each of the doped amorphous regions 143 has a higher concentration of C or N than the lower portion thereof.

Still further, as shown in FIGS. 3 and 4, in this embodiment, the doped amorphous regions 143 are formed to the same depth as the amorphous regions 140. However, the present inventive concept is not so limited. Rather, only an upper portion of each of the amorphous regions 140 may be doped to form the doped amorphous regions 143.

Moreover, the present inventive concept may be applied to the manufacturing of an n-channel metal oxide semiconductor (nMOS) transistor. In an example of this application of the inventive concept, a photoresist pattern is formed on the substrate 100 to cover all regions of the substrate except for those that will constitute nMOS regions of the transistor (i.e., the photoresist pattern is formed to cover those regions for the substrate 100 that will constitute p-channel metal oxide semiconductor (pMOS) regions). However, typical photoresist hardens at a temperature of −100° C. or below, and it is difficult to remove hardened photoresist. Therefore, the C or N implantation process is preferably performed at a temperature of more than −100° C.

Figure 5:
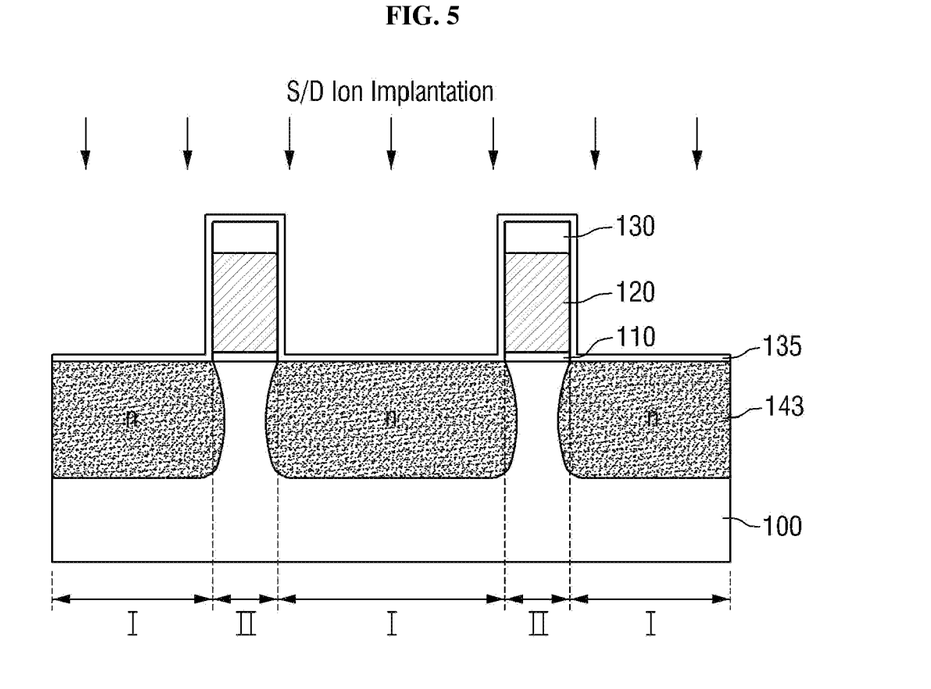

Referring to FIG. 5, next, in this example of manufacturing an nMOS device, an ion implantation process is performed on the source/drain regions I to dope the amorphous regions 143, i.e., the source/drain regions I, with n-type impurities such as As or P. In this respect, if the C or N had been implanted (S120) at a dosage of more than 5E15 atoms/cm$^2$, the activation (saturation) of the source/drain regions I with the n-type impurities could be inhibited by the implanted C or N. Thus, as mentioned above, the C or N is preferably implanted at a dosage of 1E14 to 5E15 atoms/cm$^2$ to ensure that the source/drain regions I are activated.

Note, as should be clear from the description above, the present inventive concept is not limited to a method comprising an S/D ion implantation process as shown in and described with reference to FIG. 5. In another example of the inventive concept, a lightly doped drain (LDD) ion implantation process may be performed instead such that each of the source/drain regions I has an LDD structure.

Figure 6:
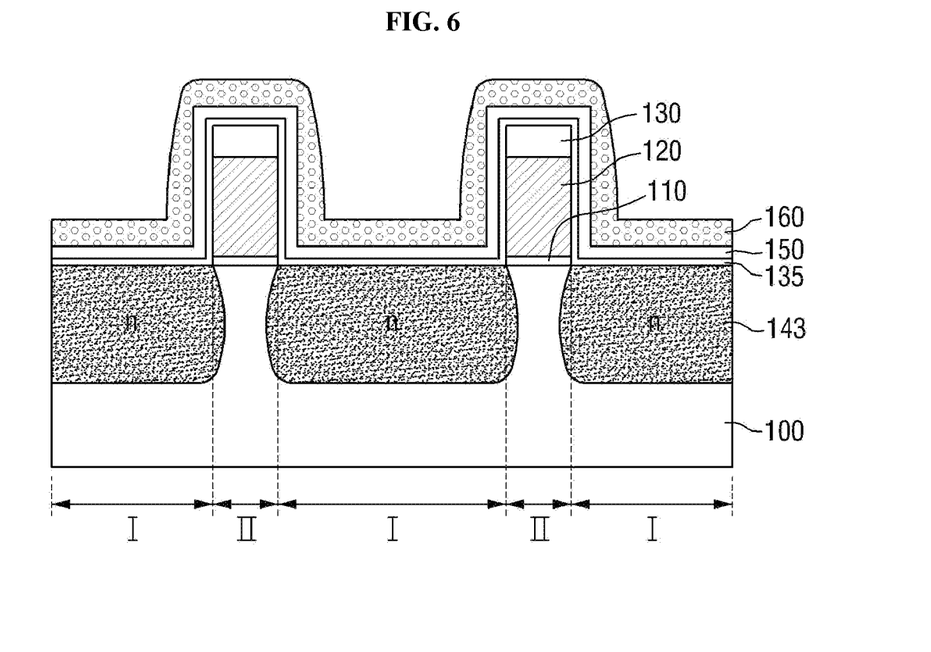

In any case, referring to FIGS. 1 and 6, next, a stress inducing layer 160 is formed (conformally) on the substrate 100, i.e., so as to cover the spacer film 135 (operation S130). Also, a buffer oxide film 150 may be formed (conformally) on the spacer film 135 before the stress inducing layer 160 is formed. Therefore, in this case, the stress inducing layer 160 is formed on the buffer oxide film 150. Also, the buffer oxide film 150 and the stress inducing layer 160 may be formed by a deposition process such as by atomic layer deposition (ALD) or chemical vapor deposition (CVD).

Furthermore, the stress inducing layer 160 is formed of material which can apply tensile stress to the channel region II. Also, in this example, the buffer oxide film 150 is formed of material having a high etch selectivity with respect to that of the stress inducing layer 160 so that the buffer oxide film 150 can be used as an etch stop film when the stress inducing layer 160 is removed. In addition, the buffer oxide film 150 can prevent the gate electrode 120 and the spacer film 135 from being damaged during the removal of the stress inducing layer 160.

Thus, in an example in which the method is applied to the forming of an nMOS device, the buffer oxide film 150 is formed of silicon oxide, and the stress inducing layer 160 is formed of silicon nitride. However, the stress inducing layer 160 can be formed of other materials besides silicon nitride.

Referring to FIGS. 1 and 7 through 9, the substrate 100 is then annealed to recrystallize the source/drain regions I (S140).

Figure 7:
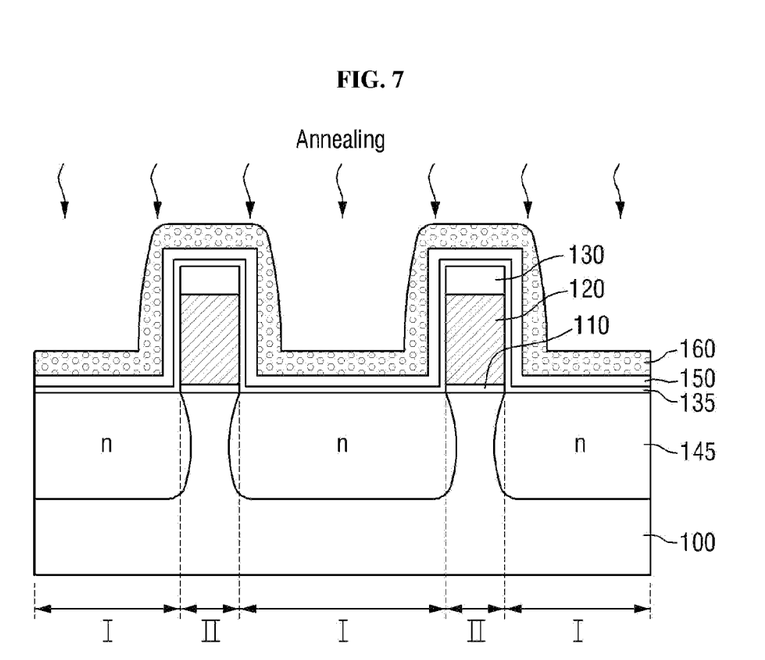

For example, the substrate 100 is subjected to a solid phase epitaxy (SPE) non melt process in which the substrate is annealed at a relatively low temperature.

More specifically, the substrate 100 may be annealed at a temperature in a range of 450 to 800° C. and in an atmosphere of $N_2$, $H_2$ and $O_2$, for example, to crystallize the doped amorphous regions 143 while the solid phase of the regions is maintained. Thus, in the example of the manufacturing of an nMOS device as described above, the doped amorphous regions 143 are recrystallized into n-type semiconductor films 145, each of which is a source/drain of an nMOS transistor.

In addition, at this time, the stress inducing layer 160 stresses the doped amorphous regions 143 while the regions 163 are being recrystallized. The stress deforms the crystals and the crystals remain deformed regardless of whether the stress inducing layer 160 is subsequently removed. That is, the semiconductor films 145 memorize the stress exerted on the amorphous regions 143 by the stress inducing layer 160. In an example of this embodiment, the SPE process causes the Si of the substrate 100 to combine with C implanted into the substrate 100 and thereby form SiC. The crystalline SiC has a smaller lattice constant in the <110> direction than the amorphous Si. Accordingly, the source/drain regions I and more specifically, the semiconductor films 145, contract and as a result, continuously apply tensile stress to the channel region II therebetween. This, in turn, alters the lattice structure of the channel region II. As explained earlier, the altered lattice structure increases charge-carrier mobility, such that the performance of the final semiconductor device is enhanced.

However, the crystals formed in the doped amorphous regions 143 by the SPE process, as part of the SMT, can grow at different rates in various directions. For example, with reference to FIG. 8, the crystal growth rate may be higher in a <001> direction than in a <110> direction in a case in which the <001> direction is perpendicular to the surface of the substrate 100 and the <110> direction is substantially parallel to the upper surface of the substrate 100. As a result, points at which crystal growth pinches off may occur near a (111) facet, causing defects such as stacking faults.

Figure 8:
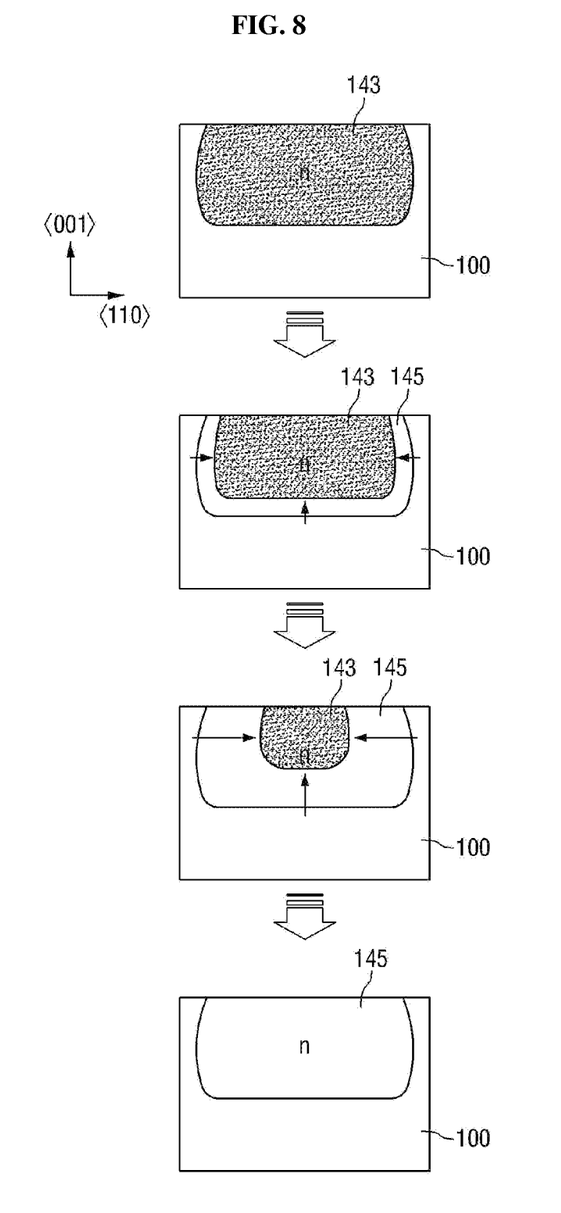

However, in the first embodiment of the method of manufacturing a semiconductor device according to the present inventive concept, such defects in the semiconductor films are prevented from being created when the doped amorphous regions 143 are recrystallized by the SPE process because the doped amorphous regions 143 contain C or N.

Figure 9:
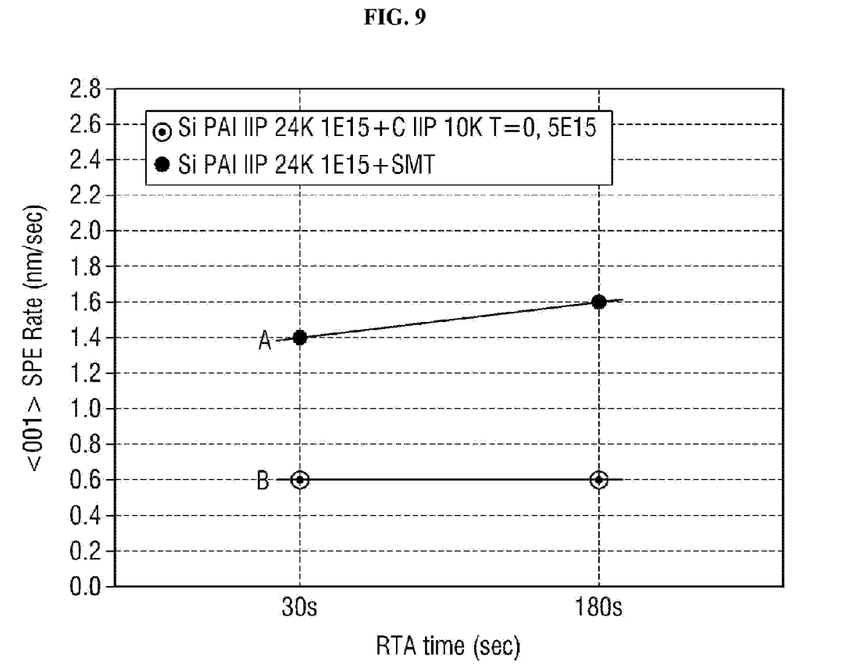
FIG. 9 is a graph illustrating, for comparative purposes, <001> solid-phase epitaxy (SPE) crystal growth rates during the stage of the method shown in FIG. 7 and during a corresponding stage of a similar method but which omits the post PAI doping process.

Referring to FIG. 9, line A represents the crystal growth rates in the <001> direction when an amorphous region of a substrate, formed by a PAI process using Si, is subjected to a rapid thermal annealing (RTA) of an SPE process without the amorphous region having been doped after the PAI process. Line B represents the crystal grow rates in the <001> direction when an amorphous region of a substrate, formed by a similar PAI process using Si, is subjected to the same RTA of an SPE process but wherein the amorphous region was doped with C between the PAI and RTA processes according to an aspect of the inventive concept. As the graph of FIG. 9 shows, when the RTA was carried out continuously for 30 seconds, the crystal growth rate in the <001> direction of the amorphous region which did not contain any C impurities (represented by line A) was approximately 1.4 nm/sec, whereas the crystal growth rate in the <001> direction of the doped amorphous region (represented by line B) was approximately 0.6 nm/sec. Therefore, these results show that the additional step of C implantation, according to an aspect of the inventive concept, reduces the crystal growth rate in the <001> direction by approximately 60%, compared to a similar method in which the SPE process is performed but which omits the doping (C implantation) process.

Accordingly, it is shown that the first embodiment of the method of manufacturing a semiconductor device according to the present inventive concept can reduce the difference between the crystal growth rates in the <001> and <110> directions and hence, can reduce crystal defects.

In this respect, FIG. 8 shows how the SPE process proceeds in a manner in which crystal growth is not pinched off near the (111) facet. In addition, the present inventors have confirmed that these results are similar to those which would occur even if the stress inducing layer 160 were not present during recrystallization.

Figure 10:
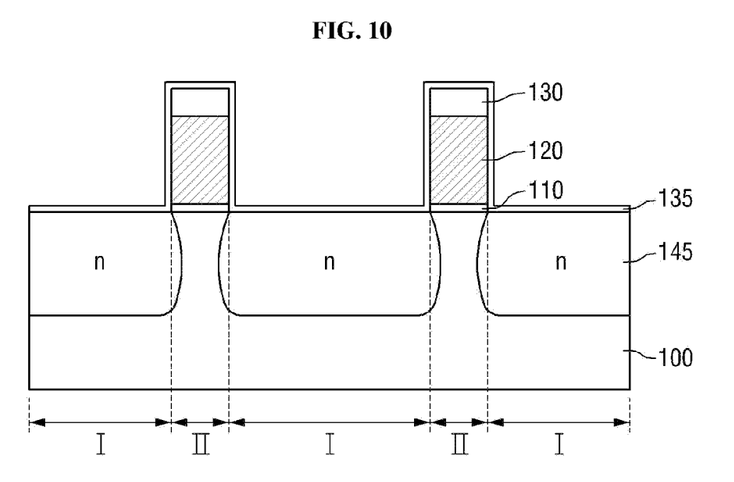

Subsequently, as shown in FIGS. 1 and 10, the stress inducing layer 160 may be removed (S150).

In this respect, the stress inducing layer 160 may be removed by wet etching using $H_3PO_4$. Alternatively, the stress inducing layer 160 may be removed by dry etching. In any case, the buffer oxide film 150 serves as an etch stop layer when the stress inducing layer 160 is removed, owing to the etch selectivity between the buffer oxide film 150 and the material chosen for the stress inducing layer 160.

Next, the buffer oxide film 150 may be removed by wet etching or dry etching. For example, the buffer oxide film 150 may be removed by a wet etching process using a solution of HF.

In another example of the first embodiment, though, the stress inducing layer 160 may be left on the substrate 100 as shown in FIG. 7. That is, the final semiconductor device may include the stress inducing layer 160.

A second embodiment of a method of manufacturing a semiconductor device according to the present inventive concept will now be described with reference to FIGS. 2, 5 through 7, and 10 through 12. For simplicity, the following description will mainly focus on the differences between the first and second embodiments. That is, except as otherwise described in detail, the second embodiment is carried out similarly to the first embodiment and may entail all of the variations described with reference to the first embodiment.

Figure 11:
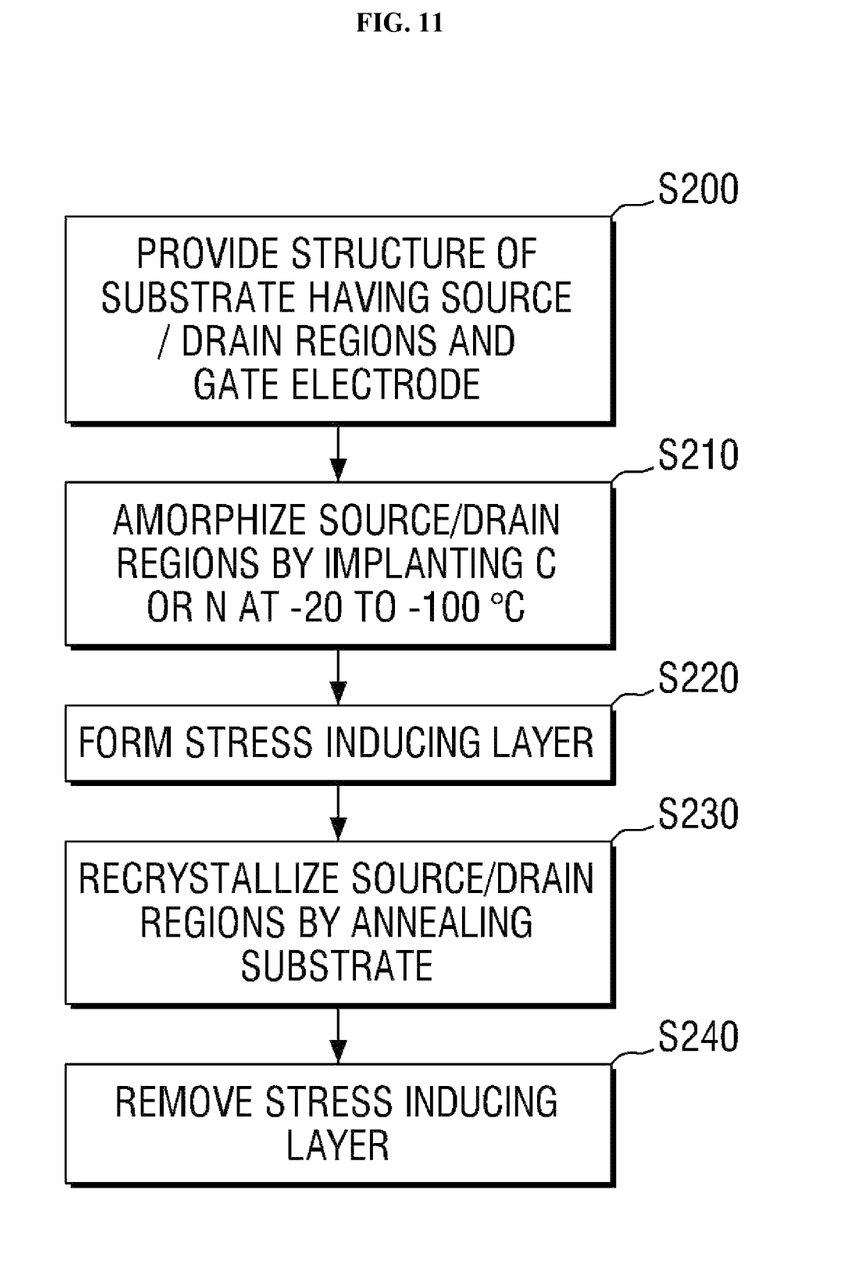
FIG. 11 is a flowchart of a second embodiment of a method of manufacturing a semiconductor device according to the present inventive concept.

Referring now to FIGS. 2 and 11, a structure comprising a gate electrode 120 on a substrate 100 is provided, such that the substrate 120 has source/drain regions I located to both sides of the gate electrode 120 (S200).

Figure 12:
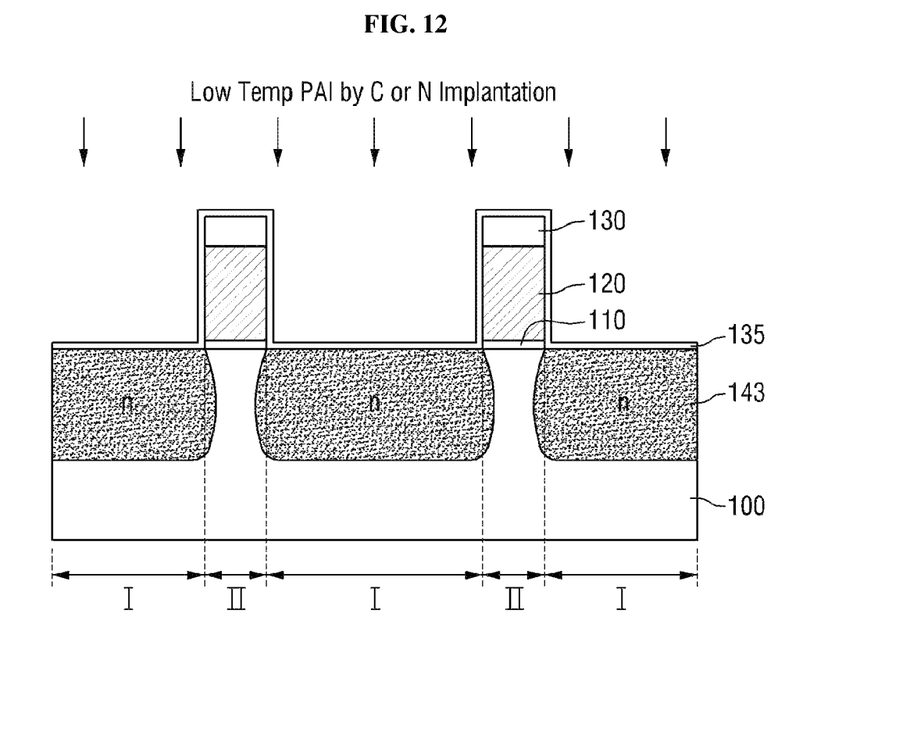
FIG. 12 is a cross-sectional view of an intermediate structure formed by an essential process in the second embodiment of the method of manufacturing a semiconductor device according to the present inventive concept.

Referring to FIGS. 11 and 12, next, a PAI process (S210) is carried out to amorphize the source/drain regions I. In this embodiment, the PAI process comprises implanting C or N into the source/drain regions I. The PAI process is preferably carried out at a temperature in a range of −20 to −100° C. This extremely low temperature range is selected because the source/drain regions I might not amorphize if the C or N is implanted at a temperature greater than −20° C. and because photoresist (that covers regions pMOS regions, for example, at this time during the process) may harden if the PAI process is performed at a temperature less than −100° C.

Furthermore, the PAI process is preferably performed at an implantation energy of 5 to 10 KeV to prevent a significant part of a channel region II from amorphizing at this time due to lateral diffusion of the implanted C or N.

Next, n-conductivity type impurities may be implanted into the source/drain regions I (and more specifically, into the doped amorphous regions 143) as shown in and described with reference to FIG. 5. In this case, the C or N is preferably implanted during the prior PAI process (S210) at a dosage of 1E14 to 5E15 atoms/cm² to ensure that the source/drain regions I are activated (sufficiently saturated) by the implanted n-conductivity type impurities, as was described previously in connection with the first embodiment.

Referring to FIGS. 6 and 11, a stress inducing layer 160 is formed to cover the substrate 100 (S220).

Referring to FIGS. 7 and 11, the substrate 100 is annealed to recrystallize the source/drain regions I (S230).

Referring to FIGS. 10 and 11, the stress inducing layer 160 may be removed (S240). Alternatively, though, the stress inducing layer 160 may be left on the substrate 100, as shown in FIG. 7, such that final structure of the semiconductor device includes the stress inducing layer 160.

A third embodiment of a method of manufacturing a semiconductor device according to the present inventive concept will now be described with reference to FIGS. 2, 3, and 13 through 16. Again, for simplicity, the following description will mainly focus on the differences between the first and third embodiments.

Referring first to FIGS. 2 and 3, a structure comprising a gate electrode 120 on a substrate 100 is provided, such that the substrate 120 has source/drain regions I located to both sides of the gate electrode 120 In addition, a PAI process is performed to amorphize the source/drain regions I and thereby form amorphous regions 140.

Figure 13:
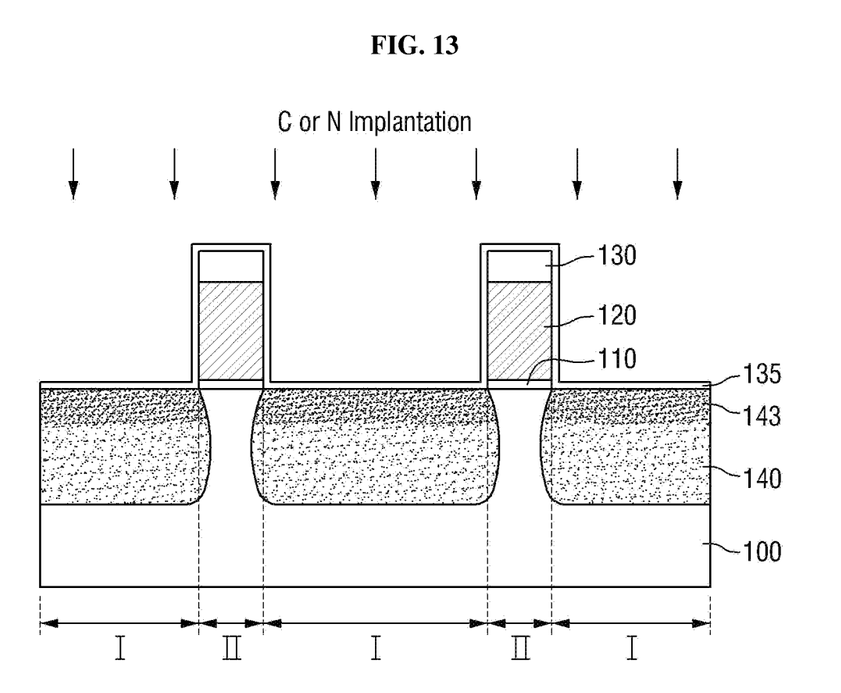
FIGS. 13 through 16 are cross-sectional views of intermediate structures and together illustrate a third embodiment of a method of manufacturing a semiconductor device according to the present inventive concept.

Referring to FIG. 13, next, C or N is implanted into only part of each of the amorphous regions 140. For example, C or N is implanted only into an upper region of each of the amorphous regions 140 (see FIG. 3) using by carrying out the implantation process at a relatively low implantation energy. As a result, undoped amorphous regions 140 are present under the doped amorphous regions 143.

Figure 14:
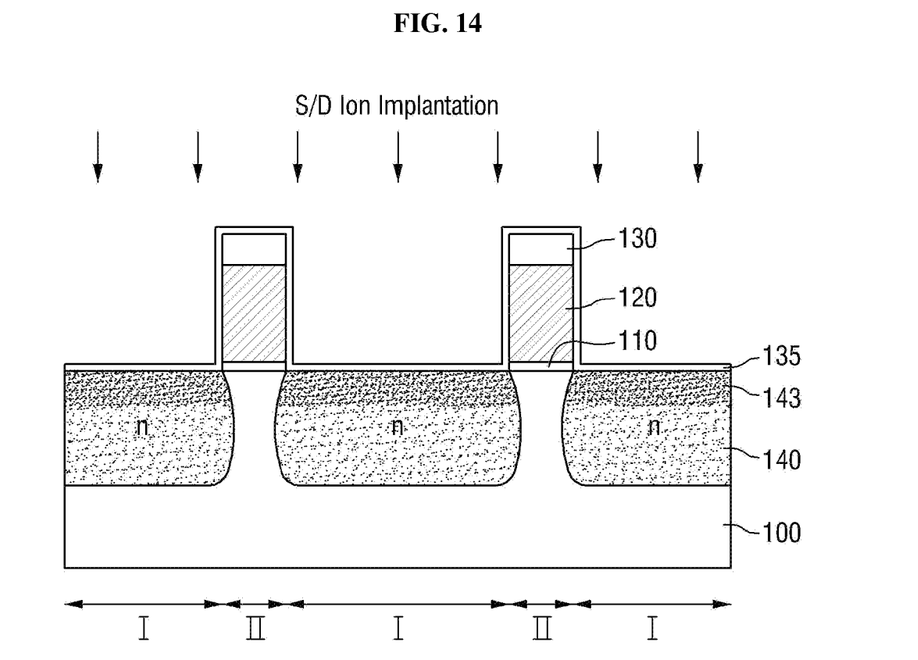

Referring to FIG. 14, n-conductivity type impurities may be into the undoped amorphous regions 140 and the doped amorphous regions 143.

Figure 15:
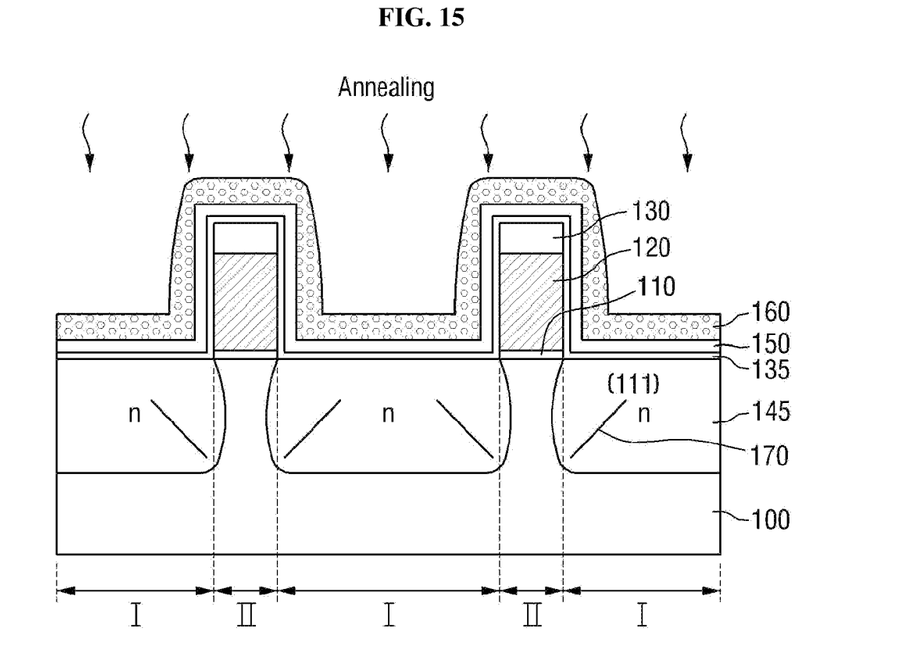

Referring to FIG. 15, a buffer oxide film 150 and a stress inducing layer 160 are sequentially formed on the substrate 100. Then, the substrate 100 is annealed in an SPE process to recrystallize the source/drain regions I and thereby form semiconductor films 145. Defects are not produced in upper portions of the semiconductor films 145, which are constituted by the recrystallized doped amorphous regions 143, because the doped amorphous regions 143 contain C or N. That is, the C or N restrain the crystal grow rate in the <001> direction during the SPE process, thereby inhibiting the formation of defects such as stacking faults. On the other hand, in the amorphous regions 140 that do not contain the C or N, the crystal growth rate during the SPE process is greater in the <001> direction than in the <110> direction. As a result, the crystal growth may pinch off near a (111) facet, leading to the formation of defective regions 170.

However, only the portion of the channel region II of the substrate 100 adjacent to the gate electrode 120 forms a channel of a transistor of a semiconductor device during operation of the device. Thus, the performance of the semiconductor device will not be significantly degraded by the defective regions 170 because these regions might only form at the lower portions of the semiconductor films 145.

Figure 16:
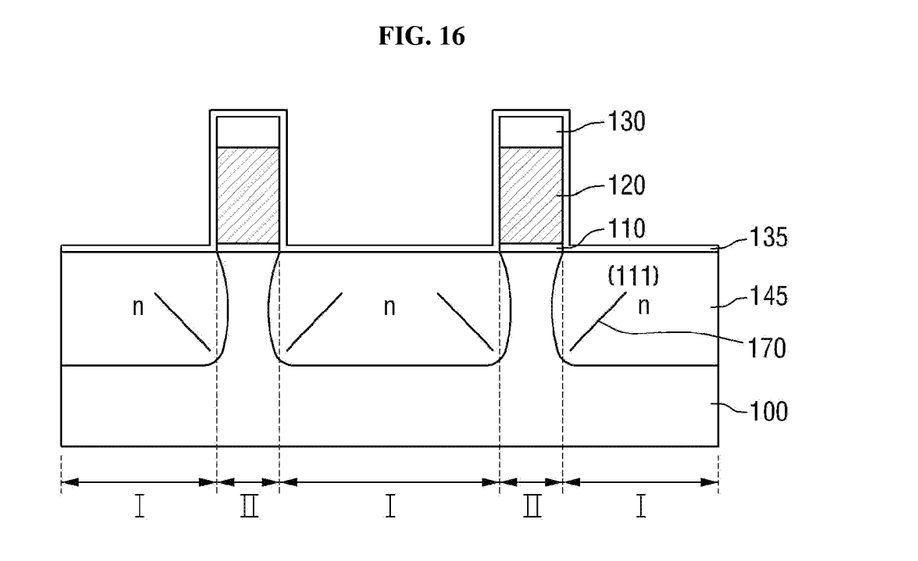

Referring to FIG. 16, next the stress inducing layer 160 may be removed.

In a method of manufacturing a semiconductor device according to the present inventive concept, amorphous source/drain regions are recrystallized to alter the lattice structure of the channel region in such a way as to increase charge carrier mobility in the channel region, and the formation of defects during the recrystallization stage is inhibited by minimizing differences between the crystal growth rates in various directions in the source/drain regions. Accordingly, practicing the inventive concept can obviate problems such as reductions in threshold voltage and increases in off-leakage current due to halo boron segregation. In addition, these effects and advantages can be realized even in methods that employ an SMT.

Finally, embodiments of the inventive concept and examples thereof have been described above in detail. The inventive concept may, however, be embodied in many different forms and should not be construed as being limited to the embodiments described above. Rather, these embodiments were described so that this disclosure is thorough and complete, and fully conveys the inventive concept to those skilled in the art. Thus, the true spirit and scope of the inventive concept is not limited by the embodiment and examples described above but by the following claims

What is claimed is:

1. A method of manufacturing a semiconductor device, the method comprising:
   providing a structure that includes a substrate, and a gate electrode at an upper part of the substrate, the gate electrode having opposite sides;
   forming doped amorphous source/drain regions to the sides of the gate electrode, respectively, such that the amorphous source/drain regions are spaced from each other across a channel region of the substrate;

subsequently annealing the substrate to recrystalize the doped amorphous source/drain regions; and before the substrate is annealed, forming over the doped amorphous source/drain regions of the substrate a stress inducing layer that stresses the doped amorphous source/drain regions during the recrystallizating of the doped amorphous source/drain regions, and wherein the forming of the doped amorphous source/drain regions comprises a pre-amorphization implantation (PAI) process that amorphizes the source/drain regions to the sides of the gate electrode, and implanting, into the amorphized source/drain regions, impurities that will minimize differences between crystal growth rates in different crystallographic directions during the annealing of the substrate.

2. The method of claim 1, wherein the implanting comprises implanting C or N into the substrate.

3. The method of claim 2, wherein the energy level at which the C or N is implanted is within a range of 5 to 10 KeV.

4. The method of claim 2, wherein the pre-amorphization implantation (PAI) process comprises implanting Si or Ge into the substrate to form amorphous source/drain regions of the substrate, and the implanting of impurities comprises doping the amorphous source/drain regions with the C or N.

5. The method of claim 4, wherein the energy level at which the Ge or Si is implanted is in a range of 10 to 35 KeV.

6. The method of claim 1, wherein the annealing of the substrate is performed within a temperature range of 450 to 800° C.

7. The method of claim 1, further comprising removing the stress inducing layer after the doped amorphous source/drain regions have been recrystallized.

8. A method of manufacturing a semiconductor device, the method comprising:

providing a structure that includes a substrate, and a gate electrode disposed on an upper part of the substrate, the gate electrode having opposite sides, wherein the substrate has source/drain regions located to the sides of the gate electrode, respectively, and a channel region interposed between the source/drain regions; and inducing stress in the channel region of the substrate by growing crystals in the source/drain regions at substantially the same rates in both <001> and <110> crystallographic directions substantially perpendicular and parallel to an upper surface of substrate, respectively, wherein the inducing of stress in the channel region comprises:

performing a pre-amorphization implantation (PAI) process that amorphizes the source/drain regions, doping the source/drain regions amorphized by the PAI process to form doped amorphous source/drain regions of the substrate, forming over the doped amorphous source/drain regions of the substrate a stress inducing layer, and subsequently subjecting the amorphous source/drain regions to a solid phase epitaxial (SPE) growth process that recrystallizes the amorphous source/drain regions, the stress inducing layer stressing the doped amorphous source/drain regions during the recrystallizating of the doped amorphous source/drain regions.

9. The method of claim 8, wherein the doping comprises implanting C or N into the source/drain regions, and the SPE growth process comprises annealing the substrate.

10. The method of claim 9, wherein the energy level at which the C or N is implanted is within a range of 5 to 10 KeV.

11. The method of claim 9, wherein the pre-amorphization implantation (PAI) process comprises implanting Si or Ge into the substrate to form the amorphous source/drain regions of the substrate, and the doping comprises doping the amorphous source/drain regions with the C or N.

12. The method of claim 11, wherein the energy level at which the Ge or Si is implanted is in a range of 10 to 35 KeV.

13. The method of claim 8, wherein the SPE process comprises annealing the substrate within a temperature range of 450 to 800° C.

14. The method of claim 8, further comprising removing the stress inducing layer after the SPE process has been carried out.

15. A method of manufacturing a semiconductor device, the method comprising:

providing a structure that includes a substrate, and a gate electrode at an upper part of the substrate, the gate electrode having opposite sides, wherein the substrate has source/drain regions located to the sides of the gate electrode;

performing a pre-amorphization implantation (PAI) process that amorphizes the source/drain regions;

implanting C or N into the amorphized source/drain regions;

forming a stress inducing layer that covers the substrate;

subsequently recrystallizing the amorphized source/drain regions by annealing the substrate; and removing the stress inducing layer after the substrate has been annealed.

16. The method of claim 15, wherein the amorphizing of the source/drain regions comprises implanting Ge or Si into the source/drain regions.

17. The method of claim 16, wherein the energy level at which the Ge or Si is implanted is in a range of 10 to 35 KeV, and the energy level at which the C or N is implanted is within a range of 5 to 10 KeV.

18. The method of claim 15, wherein the C or N is implanted at a dosage of 1E14 to 5E15 atoms/cm$^2$.

19. The method of claim 15, further comprising forming a buffer oxide film over the substrate before the stress inducing layer is formed, and wherein the stress inducing layer is formed over the buffer oxide film and comprises silicon nitride.

20. The method of claim 15, wherein the C or N is implanted into only part of each of the source/drain regions.

21. The method of claim 15, wherein the annealing of the substrate is performed within a temperature range of 450 to 800° C.

22. The method of claim 15, further comprising conformally forming a spacer film over the substrate before the the PAI process is preformed.

23. The method of claim 15, wherein the stress inducing layer induces tensile stress in the amorphized source/drain regions during the annealing of the substrate, and further comprising implanting n-conductivity type impurities into the source/drain regions such that the semiconductor device comprises an n-channel metal oxide semiconductor (nMOS) transistor.

* * * * *